United States Patent [19]

Zeitzoff et al.

[11] 4,255,760
[45] Mar. 10, 1981

[54] MULTIPLE, SUPERPOSED-CHANNEL COLOR IMAGE SENSOR

[75] Inventors: Peter M. Zeitzoff, Rochester; Teh-Hsuang Lee, Webster; Bruce C. Burkey, Rochester; Rajinder P. Khosla, Rochester; Thomas M. Kelly, Rochester, all of N.Y.

[73] Assignee: Eastman Kodak Company, Rochester, N.Y.

[21] Appl. No.: 79,736

[22] Filed: Sep. 28, 1979

[51] Int. Cl.³ ............................................... H04N 9/04
[52] U.S. Cl. ........................................ 358/41; 358/43; 358/44
[58] Field of Search ............................. 358/41, 43, 44

[56] References Cited

PUBLICATIONS

"A Three Terminal Charge–Injection Device", Jespers et al, 1975, IEEE International Solid State Circuits Conference.

Primary Examiner—Richard Murray
Attorney, Agent, or Firm—Thomas H. Close

[57] ABSTRACT

A multiple, superposed-channel, solid-state, color image sensor of the "parallel transfer" type includes a plurality of superposed generally "ladder shaped" channels in a semiconductor substrate. One "side rail" of the ladder shape provides the channel structure for a multiple, superposed-channel signal handling device, such as a charge coupled shift register. The "rungs" of the ladder shape provide a plurality of multiple, superposed-channel color image sensing sites, and the other "side rail" of the ladder shape provides a plurality of superposed "anti-bloom" drains, one drain per channel. Electrical contact to a buried channel is provided by a V-groove etching technique. A V-groove extending from the surface of the device into the buried channel provides physical access to the buried channel. A conductor, in ohmic contact with the channel, extends from the bottom of the V-groove to the surface of the device to provide electrical contact with the buried channel.

7 Claims, 18 Drawing Figures

MULTIPLE, SUPERPOSED-CHANNEL COLOR IMAGE SENSOR

BACKGROUND OF THE INVENTION

This invention relates in general to image sensing devices, and in particular to solid-state color image sensing devices.

U.S. patent application Ser. No. 959,830 entitled "Color Responsive Imaging Device Employing Wavelength Dependent Semiconductor Optical Absorption", filed Nov. 13, 1978 in the name of Burkey et al discloses a multiple, superposed-channel color image sensor wherein the differential absorption of light by a semiconductor material is employed to selectively sensitize a plurality of superposed light sensitive channels to respective bandwidths of illumination. One multiple, superposed-channel color image sensor is configured as a multiple, buried-channel charge coupled shift register having transparent transfer electrodes. The charge transfer cells of the shift register serve as a multiple, superposed-channel image sensing sites. Photocharges generated at the sensing sites and collected in respective superposed channels are simultaneously moved to a plurality of outputs by appropriately pulsing the transparent charge transfer electrodes. Respective channels "fan out" at an end of the register so that electrical contact may be made to buried channels by conductive columns of heavily doped semiconductor material. Such conductive columns, because of the depths to which they must penetrate into the substrate, are relatively difficult to manufacture. Furthermore, because each channel "fans out" in a different direction at the end of the shift register, separate masks are required for forming each channel, thereby increasing the design and fabrication costs of the device.

SUMMARY OF THE INVENTION

The features of the present invention are disclosed in the embodiment of a "parallel transfer" type color image sensing device wherein photocharges are generated at wavelength dependent depths in a semiconductor and are collected in the multiple, superposed-channels of a row of photosensing sites. The photocharges are transferred in parallel in their respective channels from the photosensing sites to a multiple, superposed-channel signal handling device such as a charge coupled shift register. The color image sensing device is comprised of a plurality of superposed generally "ladder shaped" channels in a semiconductor substrate. One "side rail" of the ladder provides the channel structure for a multiple, superposed-channel charge coupled shift register. The "rungs" of the ladder provide a plurality of multiple, superposed-channel color sensitive image sensing sites. The other "side rail" of the ladder provides a plurality of superposed "anti-bloom" drains. According to one feature of the invention, electrical contact is provided to respective superposed channels by means of an oriented differential etching technique to form a groove in the semiconductor substrate having sides generally sloping inwardly towards the bottom of the groove. The cross-section of such a groove resembles the letter V and hence, such a groove is commonly called a V-groove. The V-groove penetrates to a channel from a surface of the device and a conducting path is provided which makes ohmic contact with the channel at the bottom of the V-groove and extends up a side of the V-groove to the surface of the device to provide electrical contact to the channel, thereby obviating the need for conductive columns in the substrate.

The ends of the channel structure for the charge transfer device may "fan out", each channel "fanning" in a direction different from the other channels. A V-groove is positioned to penetrate to a fanned out portion of a respective channel. In a preferred embodiment, however, all the channels are congruent, requiring only one mask that may be employed repeatedly to form the channels. A V-shaped groove overlaps an edge of the channels so that the bottom of the groove penetrates the channel to which contact is to be made. The conductor is disposed on one side of the groove, the side away from the channel structure, to avoid shorting the channels. Such a V-groove contact is provided for an output of the signal handling device and another for a contact to an anti-bloom drain. Transfer electrode structures are provided on the surface of the device to form: the charge coupled shift register; the transfer gates for transferring the charges from the image sensing sites to shift register; the sensing gate for biasing the sensing sites; and the anti-bloom control gate for controlling the overflow potential of the anti-bloom drains.

According to another feature of the invention, the conductor provided in a V-groove comprises a heavily doped region formed by ion implantation techniques. Since temperatures over 1000° may cause the channels to migrate excessively within the substrate and thereby lose the definition necessary for the color imaging device, ion implantation rather than diffusion is employed to form the heavily doped region to protect the device from elevated temperatures subsequent to the formation of the multiple, superposed-channels. By limiting the temperatures to which the device is subjected subsequent to formation of the multiple, superposed-channels, the integrity of the channels is preserved.

In the preferred three channel version of a color image sensor incorporating features according to the present invention, the top (or "blue") channel is primarily sensitive to blue light, the middle (or "green") channel is primarily sensitive to green light, and the bottom (or "red") channel is primarily sensitive to red light. Although the top channel also has some sensitivity to green and red light, and the middle channel also has some sensitivity to red light, relatively pure color signals maybe obtained from the three channels by well known matrixing techniques. The charge coupled shift register is of a four-phase configuration although a two or three phase shift register could also be employed. The light receiving surface of each image sensing site is generally square. The width of each charge transfer cell in the charge coupled shift register is about ¼ the width of an image sensing site. To provide ample charge carrying capacity in such relatively narrow transfer cells in the shift register, the cells are configured to be relatively long, e.g. approximately 4 times as long as the sensing site is wide. In the event that a two or three phase shift register were employed, the cells would be configured to be approximately two or three times as long, respectively.

A further feature of the invention resides in the location of the contact to the "green" channel, the contact is provided across the end of the channel so that charge transfer from the "green" channel is most efficient. This feature enables the highest signal-to-noise ratio to be achieved with the "green" channel. The respective contacts to the "blue" and "red" channels are made at right angles to the direction of charge transfer in the signal handling device. A single transfer electrode structure simultaneously transfers the charge from all three channels of the charge transfer shift register to the respective outputs.

DESCRIPTION OF THE DRAWINGS

The invention will be described with reference to the drawings, where.

DESCRIPTION OF THE PREFERRED EMBODIMENT

Figure 1:
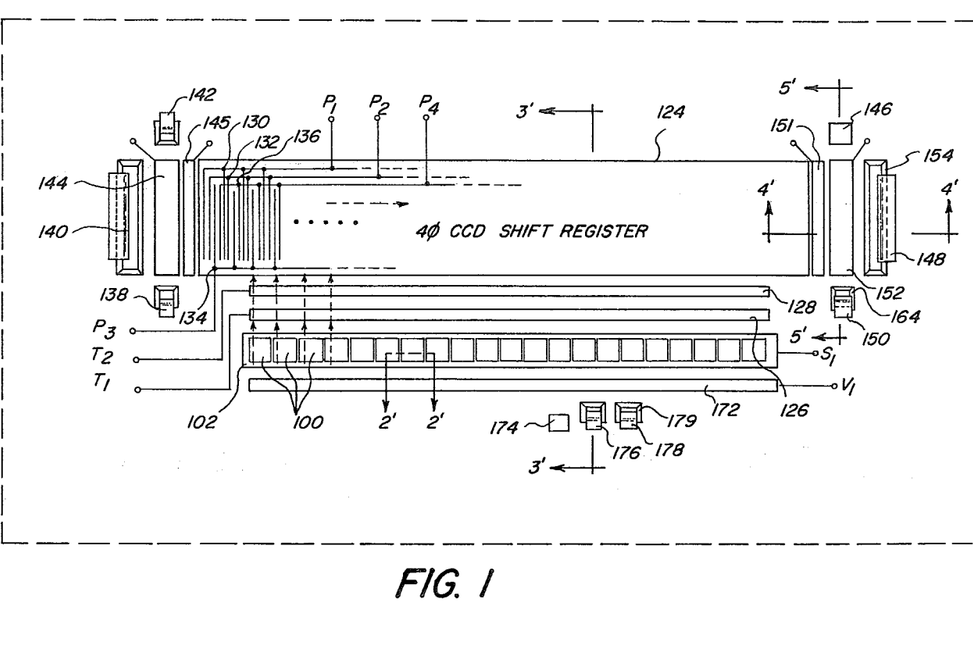
FIG. 1 is an overall schematic diagram of a multiple, superposed-channel color image sensor embodying features according to the present invention.

FIG. 1 shows a preferred embodiment of the invention incorporated in a "parallel transfer" type image sensor. In a parallel transfer configuration, photocharges are accumulated in a row of photosensing sites and then transferred, in parallel, from the photosensing sites to a charge transfer structure such as an analog shift register, from whence they are shifted serially to an output circuit. (See Charge Transfer Devices by C. H. Sequin and M. F. Tompsett, Academic Press, Inc., 1975 (hereinafter "Sequin and Tompsett"), pp. 413-146). As shown in FIG. 1, a row of multiple, superposed-channel image sensing sites 100 are disposed beneath a transparent sensing gate 102. The construction of the image sensing sites is shown in cross-section in FIG. 2. The image sensing sites are formed on a semiconductor substrate 104 of n-type material. The present description is directed to a p-channel device, but as is well known, it is equally possible to construct an n-channel device by appropriately reversing the polarity of material types. Each image sensing site 100 comprises three superposed signal storage channels, each channel being formed by a layer of p-type material isolated from adjacent channels by a layer of n-type material. By tailoring the thicknesses of the layers, as described in U.S. patent application Ser. No. 959,830 entitled "Color Responsive Imaging Device Employing Wavelength Dependent Semiconductor Optical Absorption" by B. C. Burkey et al and filed on Nov. 13, 1978, respective channels may be selectively sensitized to different wavelength ranges of light. Photosignals formed in a first signal generating region, extending from the top of the p-type layer 106 to somewhere within the n-type layer 108, are collected in what is called the "blue" channel since it responds primarily to blue wavelengths of light. Photosignals formed in a second signal generating region, extending from somewhere within the n-type layer 108 through the p-type layer 110 to somewhere within the n-type layer 112 are collected in what is called the "green" channel since it responds primarily to green wavelengths of light. Photosignals formed in a third signal generating region, extending from somewhere in the n-type layer 112 through the p-type layer 114 to somewhere within the n-type substrate 104 are collected in what is called the "red" channel since it responds primarily to red wavelengths of light. The "blue" "green" and "red" channels, in which the photocharges are collected and transmitted, reside in the p-type layers 106, 110 and 114, respectively.

Figure 2:
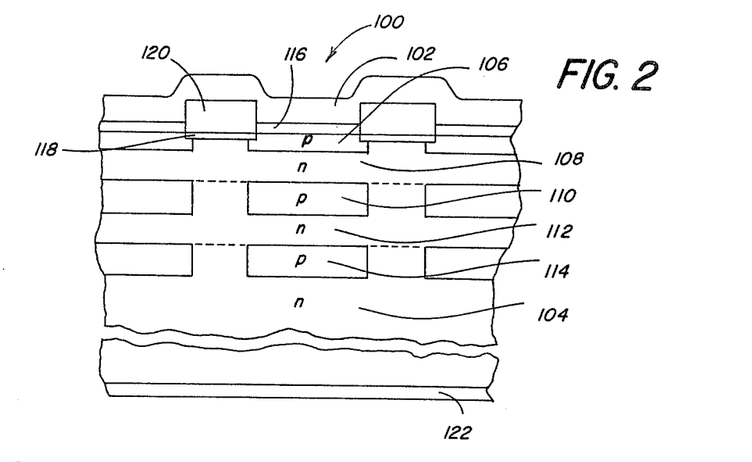
FIG. 2 is a partial cross-sectional view of the device shown in FIG. 1 taken along lines 2'—2'.

Scene light is imaged on the sensing sites through the transparent sensing gate 102. A thin gate oxide 116 insulates the sensing gate 102 from the p-type layer 106. Each sensing site 100 is isolated from adjacent sensing sites by heavily doped n-type channel stops 118 and a relatively thick field oxide layer 120. A conductive coating 122 is applied to the back side of the substrate 104 to provide electrical contact with the substrate.

Returning to FIG. 1, a four phase CCD shift register 124 is shown adjacent the row of image sensing sites. The transfer electrodes of the multiple, superposed-channel four-phase charge coupled shift register 124 are of conventional configuration, providing four individual electrodes per unit cell (see Sequin and Tompsett, page 23). However, the channel structure differs from the conventional single channel design in that each cell comprises three superposed channels corresponding to the "blue", "green" and "red" channels of the image sensing sites. Signals are transferred within the shift register in their respective channels by applying a four-phase clock signal, $P_1$, $P_2$, $P_3$ and $P_4$, to four sets of interdigitated transfer electrodes 130, 132, 134, and 136, respectively. Input contacts 138, 140 and 142 are provided to the "blue", "green" and "red" channels, respectively. Signals such as test signals, blanking signals or sync signals may be introduced into the shift register via input gates 144 and 145. Similarly, output contacts 146, 148 and 150 are provided to the "blue", "green" and "red" channels, respectively, for removing signals from the shift register. A pair of output gates 151 and 152 control egress of the signals, simultaneously, from the three channels of the shift register to the respective output contacts.

When a sensing voltage $S_1$, see FIG. 1, is applied to sensing gate 102, and scene light falls on the imaging device, photocharges form in the respective signal generating regions in each image sensing site. The photocharges thus generated are accumulated in the respective channels and may be simultaneously transferred from all three channels in all the sensing sites into a multiple, superposed-channel four-phase charge coupled shift register 124. Simultaneous transfer of charges is effected by activating parallel transfer gates 126 and 128 in succession by means of transfer pulses $T_1$ and $T_2$ applied to gates 126 and 128, respectively.

Figure 3:
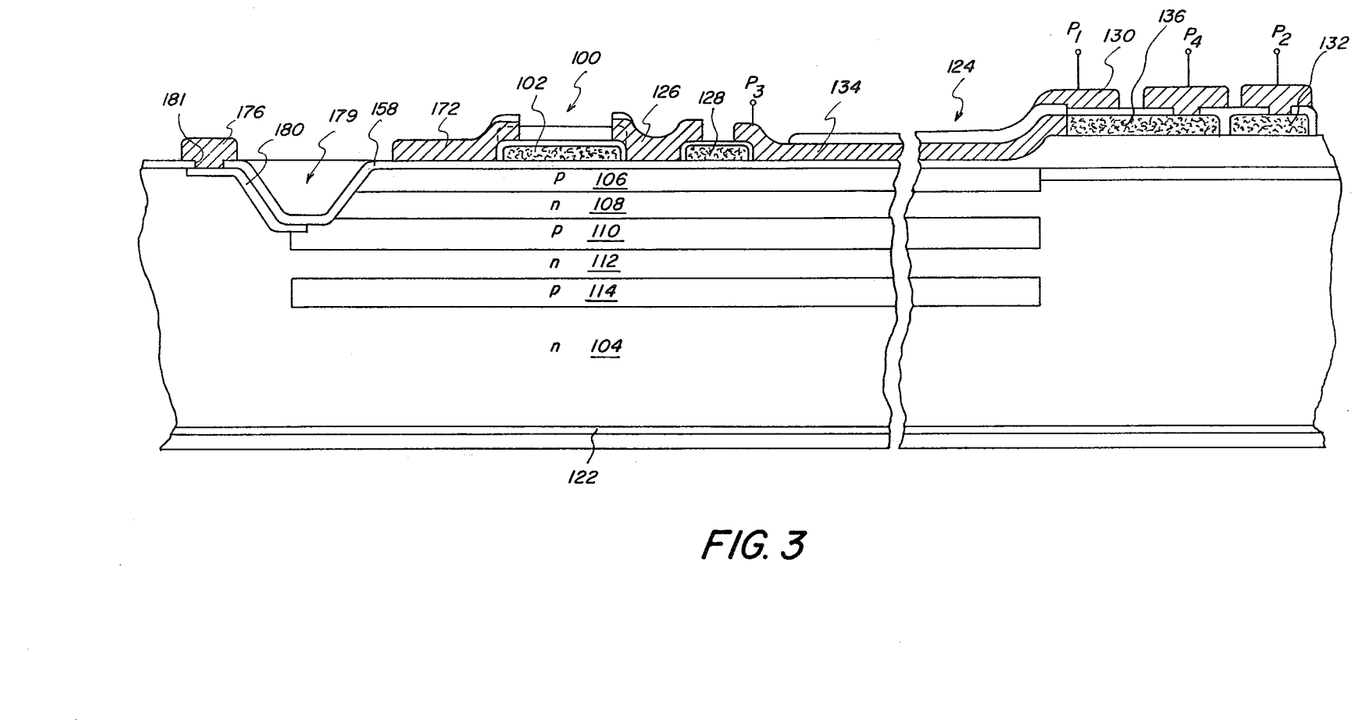
FIG. 3 is a cross-sectional view of the device shown in FIG. 1 taken along lines 3'—3'.

Transfer of photocharges from the sensing sites 100 into the unit cells of the shift register will now be described with reference to FIG. 3. FIG. 3 shows a cross-section of the imaging device taken along lines 3'—3' in FIG. 1. The section is taken through an image sensing site 100 and a third-phase electrode 134 in a unit cell of the shift register. Each sensing site is disposed adjacent a corresponding unit cell in the shift register, and the photocharges from the sensing site are introduced into the shift register, under the third-phase electrode. Since the area under the third-phase electrode of the unit cell represents approximately ¼ the total area of the unit cell, the unit cells are configured as rectangles, four times as long as they are wide and as wide as the sensing sites, to provide a charge handling capacity under each electrode equal to the charge generating capacity of the corresponding photosensing site.

To move the photocharges from the image sensing sites into the shift register, a transfer pulse is applied to transfer gate 126, thus forming three superposed potential wells beneath gate 126 for receiving the photocharges in respective channels. The sensing gate voltage $S_1$ is then removed from sensing gate 102 to move the photocharges from their poritions in the sensing sites to respective positions beneath transfer gate 126. Next, a pulse is applied to transfer gate 128 for forming potential wells thereunder, and the pulse is removed from gate 126 to shift the charges to a position beneath gate 128. Finally, a pulse is applied to the third-phase transfer electrode 136 of shift register 124 to form potential wells in the unit cells of the shift register, and the pulse on transfer gate 128 is removed to shift the photocharges into the shift register. The photocharges at their respective levels are then moved in a known manner to the output contacts 146, 148 and 150, respectively, by applying the four-phase clock signal to the transfer electrodes 130, 132, 134 and 136.

When a superposed group of photocharges (i.e. "blue", "green" and "red") are moved to respective positions beneath the fourth transfer electrode of the last unit cell of the shift register 124 (see FIG. 1), output gates 151 and 152 are pulsed in sequence to transfer the respective photocharges to output contacts 146, 148 and 150. The structure of the output contacts will now be described.

Figure 4A:
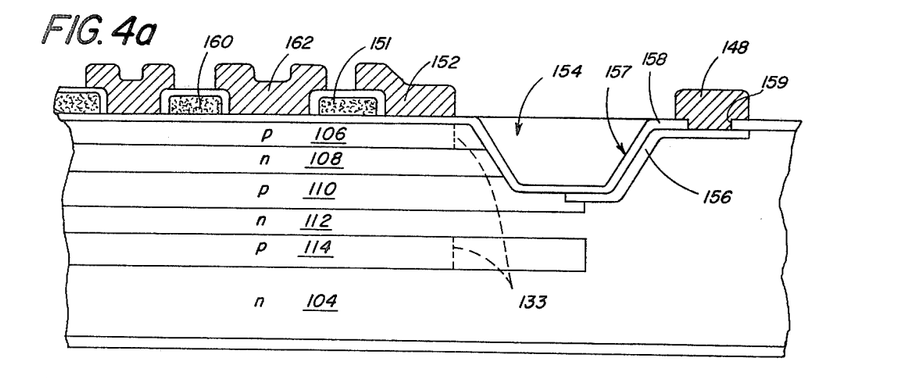
FIG. 4a is a partial cross-sectional view of the device shown in FIG. 1 taken along lines 4'—4'.
Figure 4B:
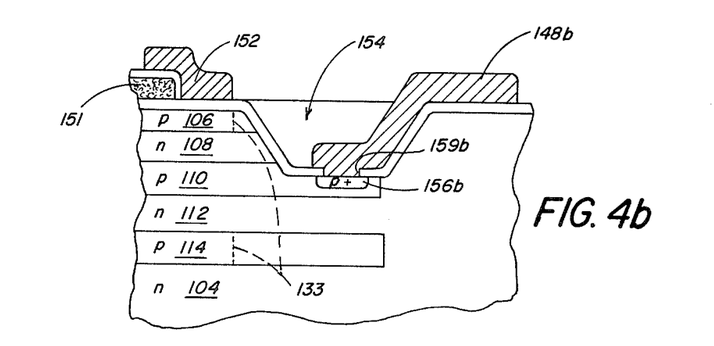
FIG. 4b shows an alternative form of the V-groove contact structure shown in FIG. 4.

Turning first to FIG. 4a, the "green" output contact is shown in cross-section. The third-phase and fourth-phase electrodes of the last unit cell in the shift register are also shown. Human visual response is more sensitive to green detail. It is therefore desirable to optimize the signal-to-noise ratio for the "green" channel. Accordingly, the "green" output contact 148 is disposed in a direction across the direction of flow of the signal charges in the shift register to provide the most efficient charge transfer out of the shift register for the "green" photocharges. Photocharge in the "green" channel is carried in the p-type layer 110. Electrical contact with layer 110 is provided by a V-groove contact structure comprising a V-groove 154 in the surface of the device, the V-groove terminating in layer 110. A highly doped (in this case p-type) conducting channel 156 is provided on the side 157 of the groove. The conducting channel begins at the bottom of the V-groove making ohmic contact with layer 110, proceeds up the side 157 of the groove opposite the multiple buried channel structure, and terminates on the upper surface of the substrate 104. An oxide layer 158 which covers the surface of the device, also covers the conducting channel 156 in the V-groove. A window 159 is provided in the oxide layer so that electrode 148 may make ohmic contact with conducting channel 156. Alternatively, as shown in FIG. 4b, the highly doped region as shown at 156b is confined to the bottom of the V-groove, and the electrode 148b extends from the surface of the device, down the side 157 of the V-groove, to make contact with the highly doped region through window 159b provided in the oxide at the bottom of the groove.

If separate masks are employed for a "fanned out" channel structure at the end of the shift register (see FIGS. 6b–d), p-type layer 106 and 114 will extend only as far as shown by dotted lines 133 in FIG. 4a. In the preferred embodiment, however, p-type layers 106, 110 and 114 are congruent, being formed by using the mask, shown in FIG. 6a, repeatedly. In the case where the channels are "fanned out", conductor 156 or electrode 148b may be disposed on all sides of the V-groove without shorting out the channels. In the preferred embodiment where only one mask is employed, however, the conductor 156 or the electrode 148b is disposed on the side 157 of the V-groove away from the channel structure (as shown in FIGS. 4a and 4b) to avoid shorting the channels.

When a photocharge in the "green" channel has been shifted to a position under the transfer electrode 136, the charge is transferred to the output contact 148 in the following manner: (1) A pulse is applied to the transfer electrode 130 thereby creating a potential well thereunder; (2) The pulse is then removed from the transfer electrode 136 thereby shifting the photocharge from the position beneath electrode 136 to a position beneath electrode 130; (3) A pulse is applied to output gate 151 and the pulse is removed from the transfer electrode 130 thereby shifting the charge to a position beneath output gate 151; and (4) A pulse is applied to output gate 152 and the pulse removed from gate 151 thereby shifting the charge to conducting channel 156 and thence to output contact 148.

Figure 5:
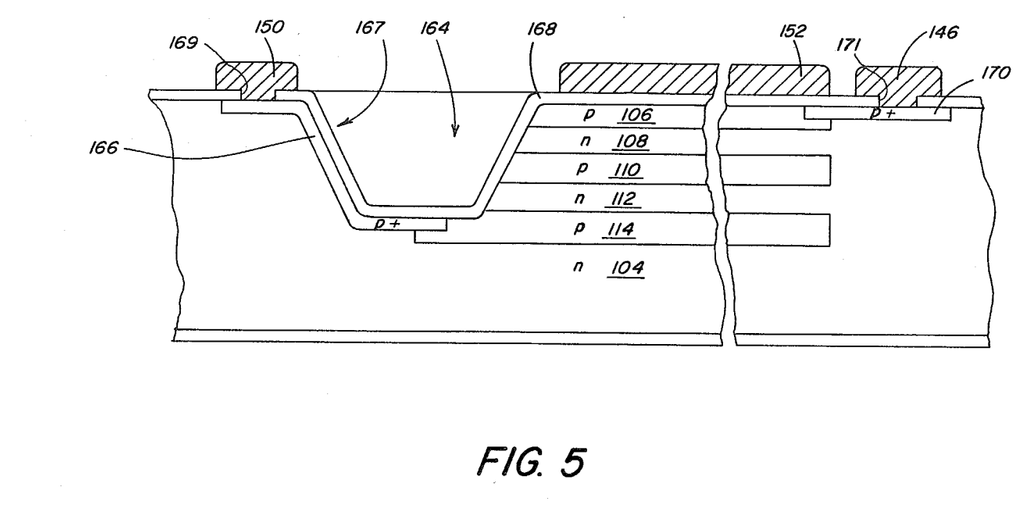
FIG. 5 is a cross-sectional view of the device shown in FIG. 1 taken along lines 5'—5'.

The output structure for signals from the "blue" and "red" channels will now be described with reference to FIG. 5. The photocharge in the red channel is carried in p-type layer 114. A V-groove 164 penetrates from the surface of the device into the layer 114 and a conductor formed by a highly doped p-type region 166 extends from the bottom of the V-groove, making ohmic contact with the layer 114, extending up the side 167 of the V-groove opposite the buried channel layers, and ending on the surface of the device. An oxide layer 168 is disposed over the inside of the V-groove and over conductor 166. A window 169 is provided through the oxide on the surface for output contact 150. Charge is transferred to output contact 150 from the shift register in the same manner as described previously for transfer of charge to output contact 148.

Photo charges in the "blue" channel are carried in p-type layer 106. Since layer 106 is near the surface of the device upon which the electrodes are disposed, a V-groove contact is not required. A highly doped p-type area 170 is provided for ohmic contact with layer 106. Oxide layer 168 covers area 170 and a window 171 is provided therein for output contact 146. Charge is transferred from the shift register to output contact 146 in the same manner as described above for the transfer to output contacts 148 and 150.

To prevent overflow of excess photocharges from one highly illuminated image sensing site to an adjacent site thereby causing spreading or "blooming" of the image, "anti-bloom" drains have been provided to each channel such that excess charge will overflow into the drains rather than into adjacent sites or into the unit cells of the shift register. Referring to FIG. 1, an anti-bloom control gate 172 is provided adjacent the row of picture sensing elements. The voltage $V_1$ that is applied to the control gate 172 determines the overflow potential into the anti-bloom drains. The three superposed drains corresponding to the "blue", "green" and "red" channels lie beneath gate 172. Each drain communicates with the corresponding channel in each sensing site. Electrical connections for biasing the respective drains are provided by contacts 174, 176, and 178 for the "blue", "green" and "red" channels, respectively. Contact to the top, or "blue", anti-bloom drain is provided in a conventional manner. Contacts to the "green" and "red" anti-bloom drains are provided by the V-groove technique described above. FIG. 3 shows a cross-section of the "anti-bloom" control gate 172 and the V-groove contact to the "green" drain. The V-groove 179 penetrates the p-type layer 110 into which the excess "green" photocharges may overflow from the image sensing site 100. A conductive strip 180 of heavily doped p-type material is disposed to make ohmic contact with the layer 110 and extends up the side of the V-groove to the surface of the device. An oxide layer 158 covers the conductive strip 180 and a window 181 is provided therein for contact 176. The contact to the "red" drain (not shown in FIG. 3) is provided by a similar V-groove structure which penetrates the p-type layer 114 into which excess photocharges from the "red" channel of the image sensing sites may overflow.

Manufacture of the multiple, superposed-channel color image sensor will now be described with reference to the following processing flow chart:

PROCESSING FLOW CHART

A. Formation of Multiple Buried Channel Structure
1. Substrate Preparation
   a. Provide n-type substrate
   b. Form backside contact
2. Formation of Lower ("Red") Channel
   a. Deposit & densify mask $SiO_2$
   b. Etch $SiO_2$ to define buried channel area using mask similar to FIG. 6a
   c. Ion implant p-type layer (cross section of device at this stage shown in FIG. 7a)
   d. Strip photoresist & mask $SiO_2$
   e. Epitaxially grow n-type layer (cross section at this stage shown in FIG. 7b)
3. Formation of Middle ("Green") Channel
   a. Deposit & densify mask $SiO_2$
   b. Etch $SiO_2$ to define buried channel area using mask similar to FIG. 6a.
   c. Ion implant p-type layer (cross section at this stage shown in FIG. 7c)
   d. Strip photoresist & mask $SiO_2$
   e. Epitaxially grown-type layer (cross section at this stage shown in FIG. 7d)
4. Formation of Top ("Blue") Channel
   a. Deposit & densify mask $SiO_2$
   b. Etch $SiO_2$ to define buried channel area using mask similar to FIG. 6a
   c. Ion implant p-type layer (cross section at this stage shown in FIG. 7e)
   d. Strip photoresist & mask $SiO_2$ B. Formation of V-Grooves to Buried Channels
1. V-Grooves to Lower (Red) Channel
   a. Deposit & densify mask $SiO_2$
   b. Etch windows in $SiO_2$ where V-grooves will be
   c. Strip photoresist
   d. Oriented differential etch
   e. Strip oxide
2. V-Groove to Middle ("Green") Channel
   a. Deposit & densify mask $SiO_2$
   b. Etch windows in $SiO_2$ where V-grooves will be
   c. Strip photoresist
   d. Oriented differential etch
   e. Strip oxide C. Formation of Super Structure (Gates & Contacts)
1. Provide Channel Stops
   a. Deposit n+ doped $SiO_2$ & undoped $SiO_2$
   b. Etch $SiO_2$ from channel area using mask similar to FIG. 6a
   c. Clean
   d. Anneal
2. Form Polysilicon Electrode Structure
   a. Form gate oxide
   b. Deposit polysilicon
   c. Ion implant polysilicon
   d. Form mask oxide
   e. Etch oxide leaving mask similar to FIG. 8 p2 f. Etch polysilicon to define electrode structure similar to FIG. 8
3. Form Conductors in V-Grooves
   a. Form mask oxide
   b. Etch oxide from areas where conductors will be
   c. Ion implant p+ type conductors
   d. Clean
4. Form Metal Electrode Structure
   a. Form isolation oxide
   b. Etch contact holes to polysilicon electrodes
   c. Clean
   d. Metalize front side (aluminum)
   e. Form photoresist mask of metal electrode structure similar to FIG. 9
   f. Etch metal to leave electrode structure similar to FIG. 9
   g. Clean
5. Metalize Backside to Provide Contact to Substrate The starting material (step A1a) is a wafer of n-type silicon (100), 20–40 ohms-cm. After the wafer is cleaned according to well-known procedures, the front is coated with photo resist and a back side contact is formed (step A1b) by ion implanting phosphorus at 350 KeV to a doping concentration of about $1 \times 10^{16}$ atoms/cm$^2$. The photo resist is stripped, the wafer is again cleaned and formation of the lower buried channel, the "red" channel, is begun. A layer of silicon dioxide 6000 Å thick is deposited on the front side of the wafer (step A2a) and the oxide is densified by heating for 15 minutes at 950°. The oxide is etched (step A2b) to make the mask for forming the first p-type layer of the buried channel structure. The buried channel mask is configured in a "ladder-shaped" pattern 182 shown in FIG. 6a. The channel portion 184 which forms one side of the ladder will become the charge coupled shift register, and the channel portion 186 which forms the other side of the ladder will become the "anti-bloom" drain. The "rungs" 188 of the ladder will become the individual image sensing sites.

The first p-type layer is formed by ion implanting boron through the apertures formed in the mask oxide layer to form a channel one micron deep having a dosage of $0.59 \times 10^{16}$ atoms/cm$^3$ (step A2c).

Figure 6A:
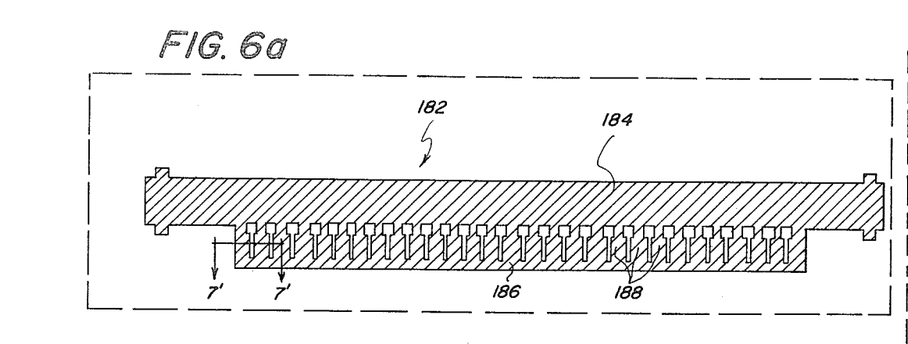
FIG. 6a is a schematic diagram of a mask employed for forming the multiple, superposed-channel structure of the device shown in FIG. 1.
Figure 6B:
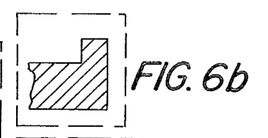
FIGS. 6b–d shows an alternative configuration for the ends of a set of masks, similar to the mask depicted in FIG. 6, wherein the "red", "green" and "blue" channels are "fanned out"
Figures 6C, 6D:
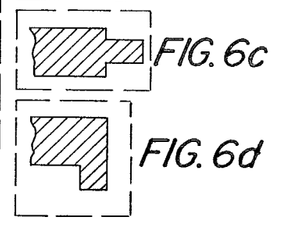
Figure 7A:
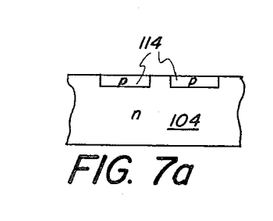
FIGS. 7a–f are cross-sectional views of image sensing sites in a device of the type constructed by employing the mask shown in FIG. 6, taken alng lines 7'—7', showing the successive steps employed to form the multiple, superposed-channel structure.

The photoresist and mask oxide are then stripped (step A2d). FIG. 7a depicts a cross-section of a portion of a device taken along lines 7′—7′ in FIG. 6 at this stage of formation, showing the n-type substrate 104 and the p-type layer 114 for two image sensing sites.

Figure 7B:
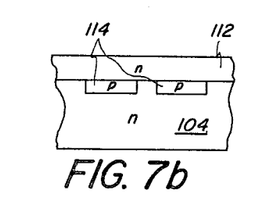

A 2.0 micron thick epitaxial layer of silicon doped with arsenic to a concentration of $0.75 \times 10^{16}$ atoms/cm$^3$ is grown over the p-type layer (step A2e). After an HCL etch at 1100° C. the epitaxial growth proceeds for 5.5 minutes at 1100° C. to form the layer. FIG. 7b shows a cross-section of the device with the epitaxially grown n-type layer 112. Formation of the first channel is now complete. The second channel is formed by steps A3a–e which are similar to the steps A2a–e described above with: the p-type layer is formed by ion implantation of Boron to form a channel one micron deep (step A3c) with a dosage of $0.83 \times 10^{16}$ atoms/cm$^3$ and the epi-layer (step A3e) being 1.1 microns thick and being doped with arsenic to an average concentration of $1.22 \times 10^{16}$ atoms/cm$^3$.

Figure 7C:
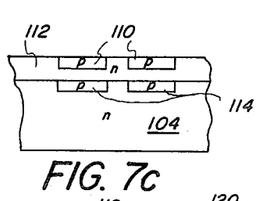
Figure 7D:
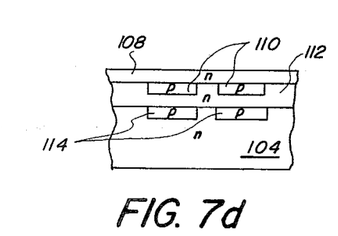

FIG. 7c shows a cross-section of the device after the ion implantation of the second p-type layer 110 and FIG. 7d shows the device after epitaxial growth of the second n-type layer 108. The top or "blue" channel of the multiple, superposed-channel structure is formed by depositing a mask layer of oxide 5000 Å thick and densifying it for 15 minutes at 950° C. (step A4a). The mask layer is etched using the same mask that was used to form the first and second layers (step A4b). The third p-type layer is formed by ion implanting boron through the aperturues formed in the mask layer to form a channel 0.3 microns deep with a dosage of $3.73 \times 10^{16}$ atoms/cm$^3$.

Figure 7E:
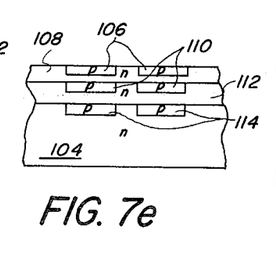

The photoresist and mask oxide are then stripped and the wafers cleaned (step A4d). FIG. 7e depicts a cross-section of the completed channel structure for the multi-channel device showing the p-type ion implanted region 106.

Alternatively, if the channel structure is to be "fanned out" at the outputs of the shift register, three different masks are used. The masks are similar to FIG. 6a but the ends of the side rail 184 are configured as shown in FIG. 6b–d for the first, second and third channels, respectively.

From this point on, care is taken to insure that the subsequent steps are carried out at as low a temperature as possible to maintain the dimensional stability and doping profiles of the respective superposed channels.

At this point, the V-grooves are formed, which will provide physical access for making the electrical contacts to the buried channels. First the V-grooves to the bottom channel are formed (steps B1a-e) in three places. The grooves will be formed at the input and output of the charge coupled shift register and the "red" channel "anti-bloom" drain (not shown). The V-grooves are formed in the chip according to the technique described by D. B. Lee in the article entitled "Anisotropic Etching of Silicon"; Journal of Applied Physics, Volume 40, No. 11, October 1969, pages 4569-4574. A mask oxide 5000 Å thick is deposited on the surface of the chip and the oxide is densified for 15 minutes at 950° C. (step B1a). Windows are etched in the mask oxide where the V-grooves will be, using standard photoresist techniques (step B1b). The photoresist is removed (step B1c) and the oriented differential etch is carried out in an etchant solution comprised of 408 ml of ethylenediamene, 192 ml of deionized water, and 38 g of pyrocatechol, for 16 minutes, 20 seconds at 60° C. to etch a groove 3.6 microns deep (step B1d).

After the grooves have been etched, the mask oxide is stripped (step B1e). Formation of the V-grooves to the middle, or "green", channel, (steps B2a–e) is carried out in a manner similar to formation of the grooves to the "red" channel with the exception that the etching step is allowed to proceed for only 7 minutes, 15 seconds to produce a shallower groove.

Figure 7F:
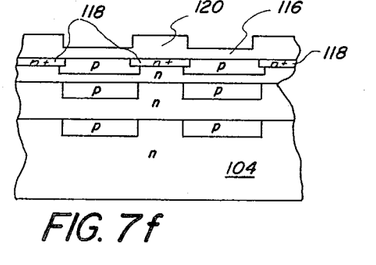

Channel stops are provided by depositing 3000 Å of silicon dioxide in an epitaxial reactor using silane gas. The silane gas is 0.36% phosphorous doped (step C1a). 7000 Å of silicon dioxide is deposited over the phosphorous doped oxide. The oxide layers thus deposited are etched away in the channel area (step C1b). The wafer is cleaned (step C1c) and annealed in nitrogen gas at 150° C. for 20 minutes (step C1d) to diffuse the phosphorous doping into the channel stop areas. The cross-section of the resulting channel structure with the channel stop 118 and field oxide layer 120 is shown in FIG. 7f.

Figure 8:
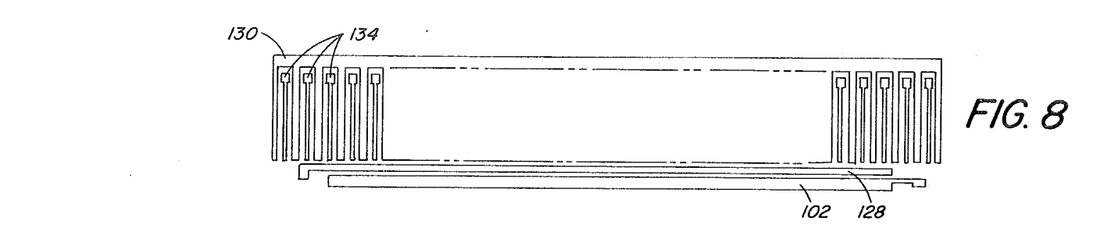
FIG. 8 is a schematic diagram of a mask employed for forming the polysilicon electrode structure of the device shown in FIG. 1.

Step C2 outlines the formation of a polysilicon electrode structure. The polysilicon structure comprises the phase 1 and 3 electrodes 130 and 134 and input and output gates 144 and 151. The transfer electrode 128 and sensing gate electrode 102 are also polysilicon. Before the polysilicon gates are formed, a 1000 Å thermal gate oxide is grown on the surface of the channel structure by heating the wafer in a wet O$_2$-dry O$_2$ atmosphere for 20 minutes and 5 minutes, respectively, then annealing at 950° C. for 20 minutes (step C2a). 5000 Å of polysilicon is deposited over the surface of the chip (step C2b) and the polyslicon is ion implanted with phosphorous at 150 KeV to a doping concentration of $6 \times 10^{15}$ atoms/cm$^2$ (step C2c). A brief mask oxidation is formed on the surface of the polysilicon by heating the chip at 950° C. for 5 minutes in N$_2$, 5 minutes in wet O$_2$, 2 minutes in dry O$_2$ and 5 minutes in N$_2$ (step C2d). A mask similar to FIG. 8 is used to etch the oxide (step C2e) to define the polysilicon electrode structure, the oxide acting as a protective mask for the polysilicon under the electrode pattern, the remainder of the polysilicon is etched away (step C2f) to leave behind the polysilicon electrode structure.

Electrical connection to the respective channels in the multichannel structure is provided in step C3. A mask oxide is formed by heating the wafer at 950° C. in a wet O$_2$ atmosphere for 5 minutes, dry O$_2$ for 2 minutes and nitrogen for 5 minutes (step C3a). Windows are etched in the mask oxide where the conducting channels will be formed by ion implantation. These conductive channels include the three input connections to the channels of the charge coupled shift register, the three output connections, and the three "anti-bloom" drain connections (step C3b). A boron ion implant at 50 KeV is performed to form the heavily doped conductive regions to an ion concentration of $3 \times 10^{15}$ ions/cm$^2$ (step C3c). The wafer is cleaned in preparation for the formation of the metal electrode structure (step C3d).

Figure 9:
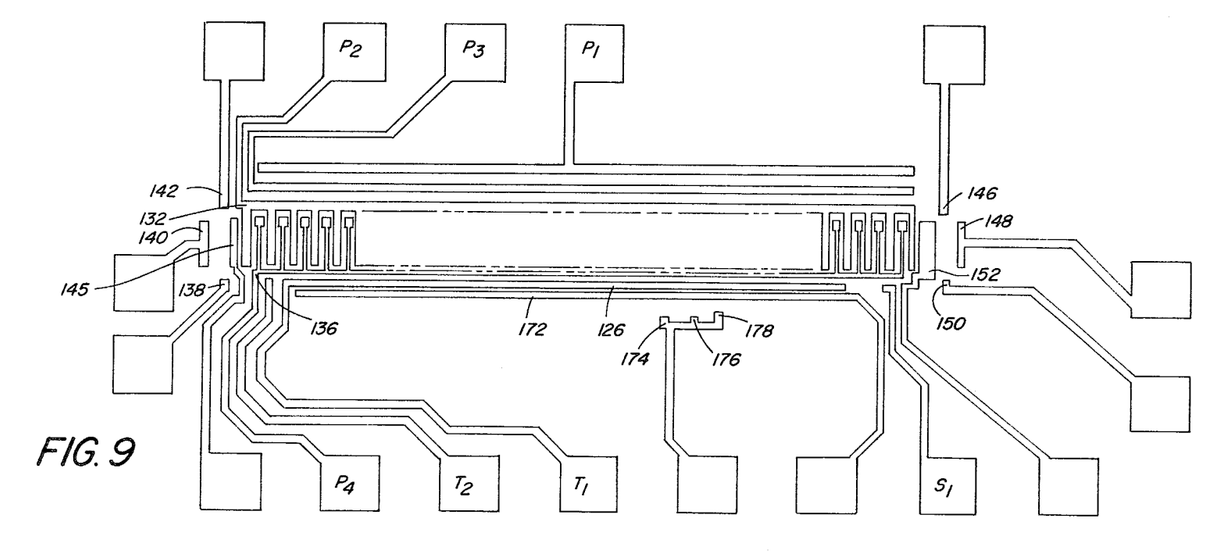
FIG. 9 is a schematic diagram of a mask employed for forming the metal electrode structure of the device shown in FIG. 1.

Step C4 outlines the procedure for forming a metal electrode structure. The metal electrodes comprise the phase 2 and phase 4 electrodes 132 and 136, respectively, of the charge coupled shift register, transfer gate 126, "anti-bloom" control gate 172, input gate 145, output gate 152, and the contact to the various polysilicon gates. An isolation oxidation is provided over the surface of the wafer (step C4a) by heating the wafer to 950°

C. in a wet $O_2$ environment for 60 minutes, a dry $O_2$ environment for 15 minutes, and annealing in $N_2$ for 30 minutes. Windows are etched in the isolation oxide (step C4b) to provide contact to the respective polysilicon electrodes. The chip is cleaned (step C4c). A metal layer, say aluminum, is deposited on the front side of the chip (step C4d) and a metal electrode mask similar to FIG. 9 is provided using standard photoresist techniques step (C4e). Excess metal is removed by standard etching techniques to leave the electrode structure of FIG. 9 (step C4f). The chip is cleaned (step C4g) to complete the formation of the electrode structure. Finally, the back side of the chip is metallized to provide electrical contact to the substrate (step C5).

In operation all areas of the device except the image sensing sites are shielded from light.

The invention has been described in detail with particular reference to preferred embodiments thereof, but it will be understood that variations and modifications can be effected within the spirit and scope of the invention.

We claim:

1. A multiple, superposed-channel color imaging device, comprising:
    (a) a semiconductor substrate having a light receiving surface;
    (b) a plurality of superposed, ladder-shaped, light responsive channels disposed within said substrate said channels being responsive to respective different wavelength ranges of light to form respective photosignals due to the phenomenon of differential absorption of light by a semi-conductor, said ladder shape comprising first and second side rails connected by a plurality of rungs, said first side rail providing channel structure for a multiple, superposed-channel charge transfer device, said rungs providing channel structure for a plurality of multiple, superposed-channel image sensing sites, and said second side rail providing channel structure for multiple, superposed anti-bloom drains;
    (c) a plurality of interdigited charge transfer electrodes disposed on said surface, over said first side rail;
    (d) a transparent sensing gate disposed on said surface over said rungs;
    (e) transfer gate means disposed on said surface between said transparent sensing gate and said charge transfer electrodes for transferring photosignals from said sensing sites to said charge transfer device;
    (f) an anti-bloom control gate disposed on said surface over said second side rail for controlling the overflow potential into said anti-bloom drains; and
    (g) output means for transferring said photosignals from said charge transfer device.

2. The invention as claimed in claim 1, wherein: said output means comprises a conductor disposed within a groove formed in said semiconductor substrate.

3. A three-color solid-state imaging device, comprising:
    (a) a semiconductor substrate having a light receiving surface;
    (b) three superposed, ladder-shaped, light responsive channels disposed within said substrate at respective distances from said light receiving surface such that: a first of said channels, disposed a first distance from said light receiving surface, being primarily responsive to wavelengths of light in the blue region of the spectrum for forming a blue photosignal; a second of said channels, disposed a second distance, greater than said first distance, from said light receiving surface being primarily responsive to wavelengths of light in the green region of the spectrum for forming a green photosignal; and a third of said channels, disposed a third distance greater than said second distance, from said light receiving surface being primarily responsive to wavelengths of light in the red region of the spectrum for forming a red photosignal; said ladder shape comprising first and second side rails connected by a plurality of rungs, said first side rail providing the channel structure for a three channel charge transfer device, said rungs providing the channel structure for a plurality of three-color image sensing sites, and said second side rail providing the channel structure for three superposed anti-bloom drains; p1 (c) a plurality of interdigitated charge transfer electrodes disposed on said surface, over said first side rail;
    (d) elongate transparent sensing gate means disposed on said surface over said rungs;
    (e) elongate transfer gate means disposed on said surface over said rungs between said transparent sensing gate and said charge transfer electrodes for causing photosignals to be transferred from said sensing sites to said charge transfer device;
    (f) anti-bloom control gate means disposed on said surface over said second side rail for controlling the overflow potential into said anti-bloom drains; and
    (g) output means for transferring said photosignals from said charge transfer device.

4. The color imaging device claimed in claim 3, wherein said image sensing sites are generally square, said charge transfer electrodes defining one unit cell corresponding to each image sensing site, the width of said first side rail being substantially equal to the width of said sensing site times the number of transfer electrodes per unit cell, whereby the area under one charge transfer electrode is substantially equal to the area of one of said image sensing sites.

5. The invention claimed in claim 3, wherein:
    said output means comprises a conductor disposed in a groove formed in said semiconductor substrate.

6. The color imaging device claimed in claim 5, wherein said ladder shaped channels are congruent, said output means being disposed adjacent respective edges of said ladder shape such that one side of said groove is adjacent to said channels and an opposite side of said groove is adjacent to said substrate, and wherein said conductor is disposed on said opposite side of said groove.

7. The color imaging device claimed in claim 6, wherein said output means for said second channel is disposed across the end of said charge transfer device.

* * * * *